United States Patent
Golladay et al.

(10) Patent No.: US 6,201,251 B1
(45) Date of Patent: Mar. 13, 2001

(54) COMPENSATION OF SPACE CHARGE IN A PARTICLE BEAM SYSTEM

(75) Inventors: Steven Douglas Golladay, Hopewell Junction; William Albert Enichen, Poughkeepsie, both of NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/143,065

(22) Filed: Aug. 28, 1998

(51) Int. Cl.[7] .................................................. H01J 37/00
(52) U.S. Cl. ............................................................ 250/396 R
(58) Field of Search .............................. 250/49.5, 492.2, 250/396

(56) References Cited

U.S. PATENT DOCUMENTS

| | | |
|---|---|---|
| 2,494,442 * | 1/1950 | LePoole ............................. 250/49.5 |
| 3,715,582 * | 2/1973 | Akahori et al. ..................... 250/49.5 |
| 3,812,365 * | 5/1974 | LePoole ............................. 250/396 |
| 4,245,159 | 1/1981 | Beisswenger ................. 250/396 ML |
| 4,287,419 | 9/1981 | Booth ........................... 250/396 ML |
| 4,661,712 | 4/1987 | Mobley ............................. 250/492.2 |
| 4,806,766 | 2/1989 | Chisholm ..................... 250/396 ML |

* cited by examiner

*Primary Examiner*—Jack Berman
*Assistant Examiner*—Johnnie Smith
(74) *Attorney, Agent, or Firm*—Graham S. Jones, II

(57) ABSTRACT

Variable space charge effects in the imaging portion of a particle beam projection system due to variations in transmitted beam current are compensated with an additional lens appropriately positioned within the imaging system and having a focal length which varies in response to the transmitted beam current.

20 Claims, 3 Drawing Sheets

COMPENSATION OF SPACE CHARGE IN A PARTICLE BEAM SYSTEM

BACKGROUND OF THE INVENTION

1. Field of the Invention

This invention relates to charged particle beam projection systems and more particularly to the imaging sections of an electron or ion beam column.

2. Description of Related Art

In a particle beam projection lithography system with sufficient beam current to provide useful tool throughput there is a problem that the Coulomb interaction causes a shift in the position of the image plane and a change in nominal magnification which vary depending on the transmitted beam current, i.e., exposure pattern density.

For a hypothetical electron beam column under consideration, Monte Carlo calculations of the effect suggest image shifts of approximately 50 microns and magnification changes of approximately 0.1%, for a 20 microAmpere change in transmitted beam current. Tolerable image shifts and magnification changes are about 10–100 times smaller than these values.

Dynamic refocusing to correct shifts of the image plane of an electron beam system in response to beam current changes is known from shaped beam lithography systems, and character projection systems, but to our knowledge, compensation of magnification effects has never before been addressed.

SUMMARY OF THE INVENTION

| Definitions | |
|---|---|
| Imaging section | - Those lenses located between the reticle plane and the target (work piece) plane of a particle beam projection system. |
| Doublet | - A pair of lenses in an optical system, e.g. a collimating lens and a final lens. |
| Lens position | - the axial position of the image side principal plane of a lens. |

While refocussing of the image shift has been suggested in the past, the present invention is new and has the advantage that it provides a correction for the change in magnification as well as compensation of the image shift.

In accordance with this invention, the optical effects of variations in beam current transmitted through an imaging system are analyzed and compensated as follows:

Space charge effects are represented by a thin diverging lens (space charge lens) at a fixed position in the optical system, the thin lens having a focal length which varies inversely with the beam current.

The imaging system is analyzed to obtain expressions for the image shift and magnification in terms of the positions and focal length of the lenses comprising the imaging system including the space charge lens.

Numerical data on the image shift and magnification as a function of beam current are used in equations to solve for the position and focal length of the space charge lens.

A compensating lens is inserted into the optical system at the position of the space charge lens, the compensating lens having a focal length which varies inversely with the beam current, the focal length being equal in magnitude and opposite in sign to the focal length of the effective space charge lens for all beam currents.

To provide a solution to the problem caused by the effective space charge lens a compensating lens is aligned with the location of the effective space charge lens adjusted to reverse the image shift and magnification change created by the effective space charge lens.

As an example of the analysis and space charge compensation of the imaging section of a particle beam column, we have derived the formulae for the lens configuration known as a doublet, which is typically preferred for the imaging section of a particle beam projection system, either in the form of a magnetic doublet for an electron beam system, or for an electrostatic doublet for an ion beam system. The doublet is comprised of a collimating lens with focal length $f_1$ positioned at a distance $f_1$ from the object plane (reticle plane), and a final lens of focal length $f_2$ positioned at a distance $f_2$ from the image plane (work piece plane), the two lenses being separated by a distance $f_1 + f_2$.

For one configuration of an imaging section, with the compensating lens located between the reticle plane and the collimating lens of the imaging system, the image shift, and magnification in the presence of space charge effects is given by the following equations:

$$d = \frac{f_2^2 (L - f_1)^2}{f_1^2 (f_1 - L - f_s)}$$

$$m = \frac{-f_2 * f_s}{f_1 (L + f_s - f_1)}$$

The equations can be solved for $f_s$ and L, as follows:

$$f_s = \frac{d * f_1^3 * m}{f_2 (f_2 + f_1 * m)^2}$$

$$L = \frac{f_1 (f_2^2 + (f_2 * f_1 * m) - (d * f_1))}{f_2 (f_2 + f_1 * m)}$$

where:
  d is the distance by which the image is shifted from the nominal image plane
  m is the magnification of the imaging doublet
  L is the distance from the final input lens to the effective space charge lens.
  $f_1$ is the focal length of the collimating lens IL
  $f_2$ is the focal length of the final lens FL
  $f_s$ is the focal length of the effective space charge lens SCL, SCL' (a negative quantity)

Preferably, the compensating lens is a rotation-free dynamic lens at the position of the effective space charge lens, the compensating lens having a focal length equal and opposite to that of effective space charge lens thereby providing approximate compensation for the defocussing and magnification effects caused by the effective space charge lens.

Preferably, in accordance with another aspect of this invention, the imaging section comprises a reticle, a collimating lens, a final lens and a work piece plane, and the compensating lens is located between the collimating lens position and the final lens position. Preferably, the imaging section comprises a reticle; a magnetic doublet comprising a collimating lens and a final lens; and a work piece plane, and the compensating lens is located between the collimating lens position and the final lens position.

In another aspect of this invention the compensating lens is located between the final lens position and the work piece plane, with the space charge compensating lens placed within the imaging system of the particle beam column, and adjusting the focal length of the compensating lens to eliminate image shifts and/or magnification changes due to variations in transmitted beam current.

Preferably the compensating lens is a rotation-free dynamic focus lens at the position of an effective space charge lens, the compensating lens having a focal length equal and opposite to that of effective space charge lens thereby providing approximate compensation for the defocussing caused by the effective space charge lens. Preferably the imaging system comprises a doublet.

In accordance with another aspect of this invention a method is provided for compensating the imaging section of a particle beam column for space charge effects as described by the following steps. Determine the image position and magnification of the imaging section in the absence of space charge effects. Determine the image position and magnification of the imaging section for a known high beam current sufficient to produce space charge effects. Use the image shift and magnification data for a transmitted beam current to determine the position of the effective space charge lens, and the relationship between the beam current and the focal length of the effective space charge lens. Incorporate into the imaging system a compensating lens aligned with the location of the effective space charge lens, and adjust the focal length of the space charge compensating lens to be equal in magnitude and sign to the focal length of the space charge lens for all beam currents.

Provide an imaging system which is a doublet and position and energize the compensating lens accord to formulae and measurements of calculated image shift and magnification data.

Position the compensating lens between a reticle plane and a collimating lens and energize the compensating lens accord to formulae and measurements of calculated image shift and magnification data.

Alternatively, position the compensating lens between a collimating lens and a final lens, and energize the compensating lens accord to formulae and measurements of calculated image shift and magnification data.

In still another aspect of the invention, position the compensating lens between a final lens and a work piece plane, and energize the compensating lens accord to formulae and measurements of calculated image shift and magnification data.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
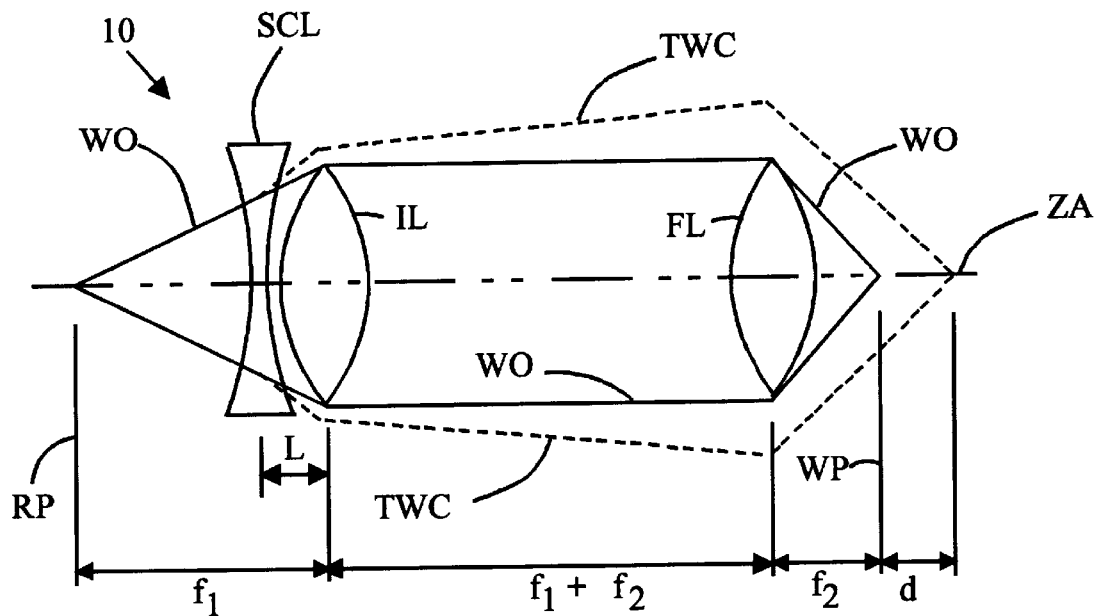
FIG. 1 shows the imaging portion of an electron beam column from the reticle plane on the left to the work piece plane on the right, showing the imaging optics of a projection system employing a doublet consisting of a collimating lens and a final lens, with an effective space charge lens located between the reticle plane and the collimating lens.

We have found how both the image shift and magnification change can be compensated by a single lens if that lens is properly positioned and energized. As an example we have worked out the case illustrated in FIG. 1 which shows the imaging portion of a particle beam projection column 10 from the reticle plane RP, also known as the object plane (on the left) to the work piece plane WP, also known as the image plane, on the right. FIG. 1 shows the imaging optics of a projection system employing a doublet of collimating lens IL and final lens FL. The collimating lens IL, which is a conventional magnetic or electrostatic lens of focal length $f_1$ acts as a condenser whereby the beam WO is intended to be collimated (rendered parallel.) The final lens FL with focal length $f_2$ is intended to focus the beam on the work piece plane WP along the trajectory of the electron beam without space charge WO.

As the transmitted beam current is reduced, space charge effects are reduced, and in the limit of zero transmitted current, the image plane is at the nominal position WP (in FIG. 1) a distance $f_2$ from the lens FL and the overall magnification "$m_o$" of the doublet is as follows:

$$m_o = -\frac{f_2}{f_1}$$

However, for the case of non-negligibly small transmitted beam current I, Coulomb repulsion causes a shift in the position of the image plane by an amount "d" and a change in the magnification of the imaging system. These variations in image position and magnification degrade the fidelity of the pattern written on the work piece and therefore must be eliminated.

The beam current transmitted through the imaging system for each pattern exposure is, or can be, known before the exposure from the reticle data. Alternatively, a detector in the imaging system could measure the transmitted beam current. For example, the current hitting the target can be measured. In view of the noise and frequency response issues associated with measuring the transmitted beam current the preferred embodiment of the invention utilizes the reticle design data to calculate the transmitted beam current for each exposure.

The first step in the compensation of space charge effects is the recognition that the space charge can be represented by a diverging lens (SCL in FIG. 1, SCL' in FIG. 3 and lens SCL" in FIG. 5) at a fixed but initially unknown position in the imaging system. The space charge lens SCL has caused the beam to diverge from path WO along the path TWC which focuses beyond the nominal image plane, the work piece plane WP. Moreover, the space charge lens SCL has a negative focal length, $f_s$, which depends on transmitted beam current according to equation of the form as follows:

$$f_s = \frac{k}{I},$$

The position of each particular one of the space charge lenses SCL, SCL' or SCL" and the value of the constant "k" must be determined for the particular optical system to be compensated. We illustrate this aspect of the invention by analyzing the imaging section illustrated in FIG. 1.

Figure 2:
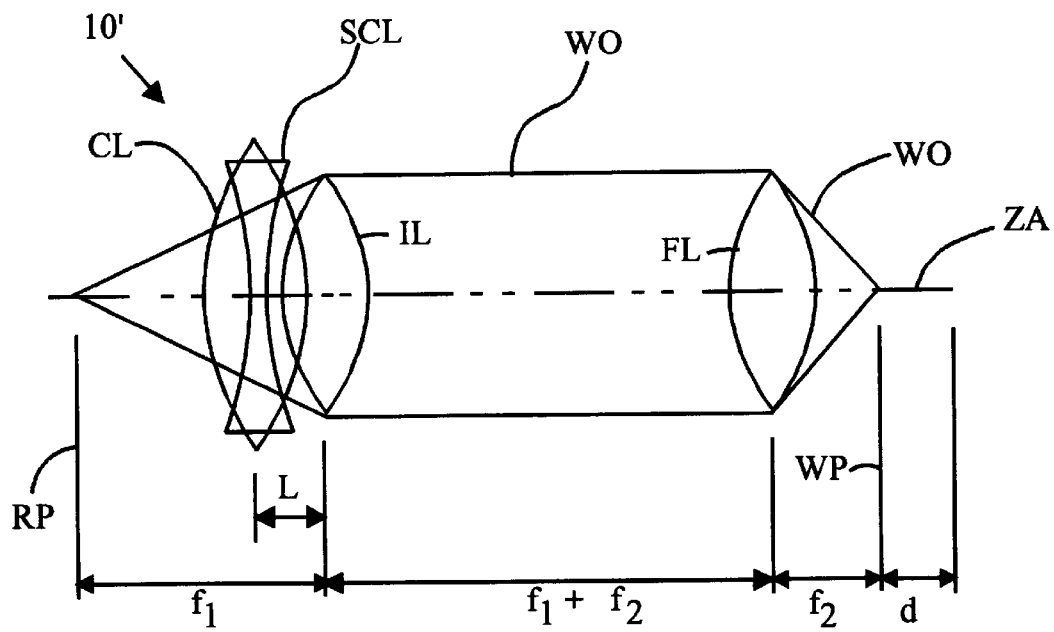
FIG. 2 shows a modified embodiment of the device of FIG. 1 with a weak rotation-free dynamic compensating lens located at the position of the effective space charge lens, with a focal length equal and opposite to that of the effective space charge lens which provides approximate effective space charge lens compensation.
Figure 3:
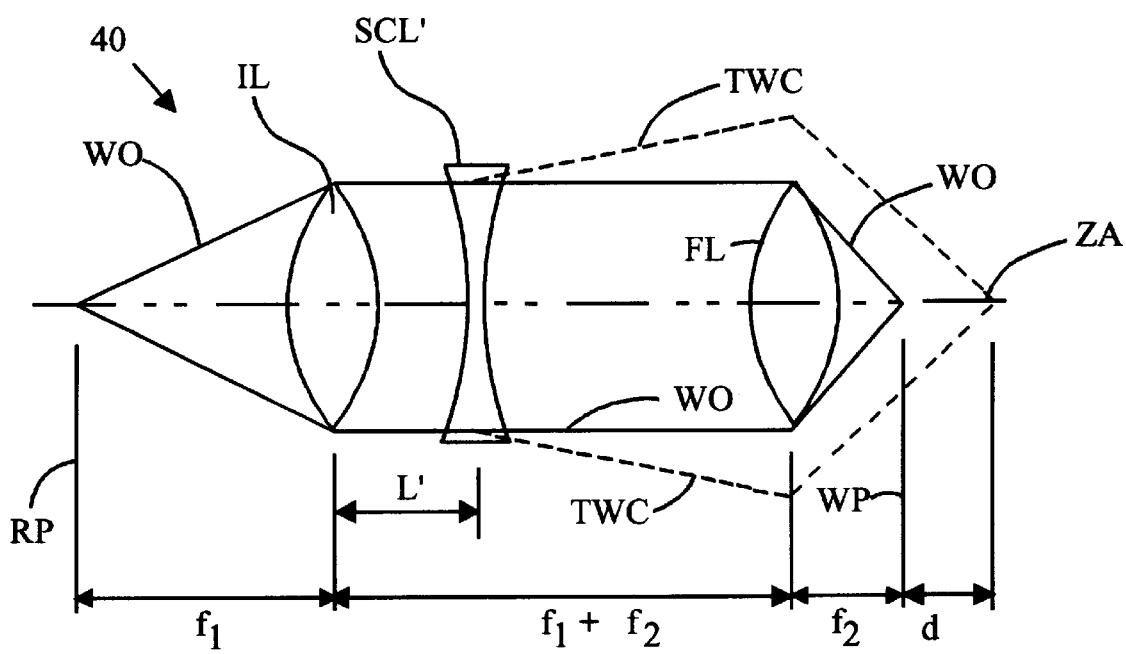
FIG. 3 shows the imaging portion of an electron beam column from the reticle plane on the left to the work piece plane on the right, showing the imaging optics of a projection system employing a doublet consisting of a collimating lens and a final lens, with an effective space charge lens located between the collimating lens and the final lens.
Figure 4:
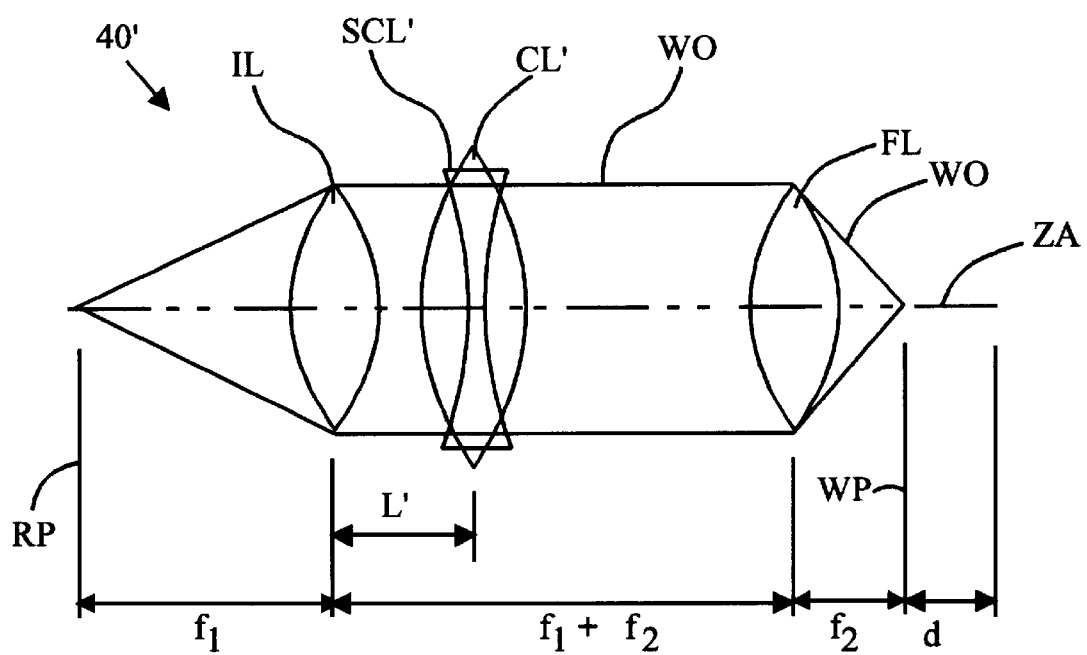
FIG. 4 shows a modified embodiment of the device of FIG. 3 with a weak rotation-free dynamic compensating lens located at the position of the effective space charge lens, with a focal length equal and opposite to that of the effective space charge lens which provides approximate effective space charge lens compensation.
Figure 5:
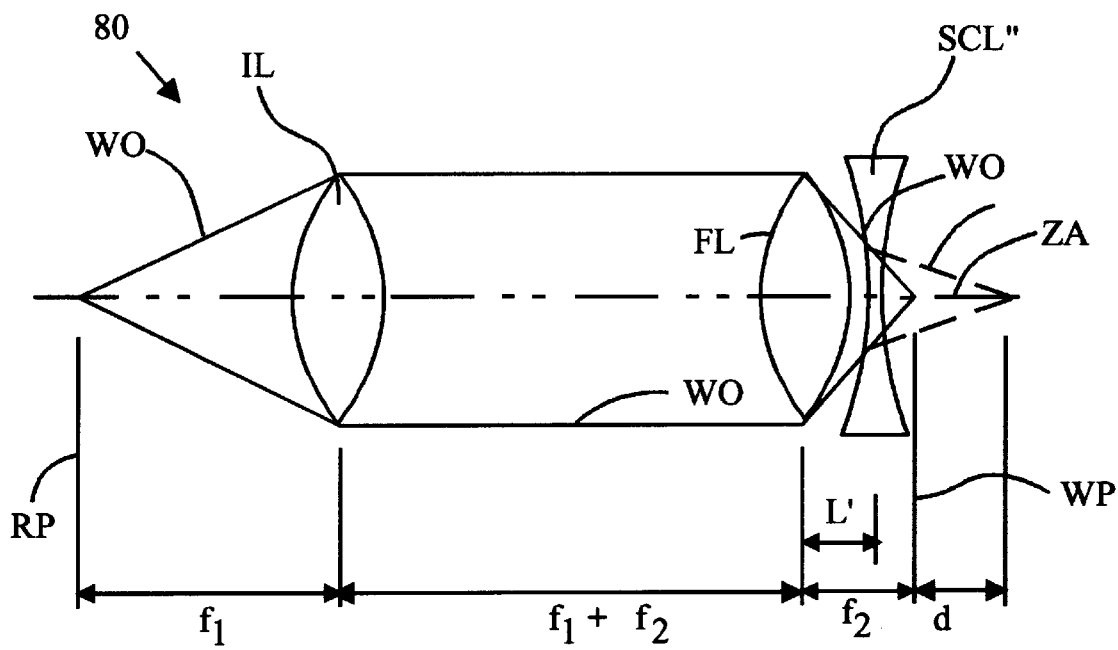
FIG. 5 shows the imaging portion of an electron beam column from the reticle plane on the left to the work piece plane on the right, showing the imaging optics of a projection system employing a doublet consisting of a collimating lens and a final lens, with an effective space charge lens located between the final lens and the work piece plane.
Figure 6:
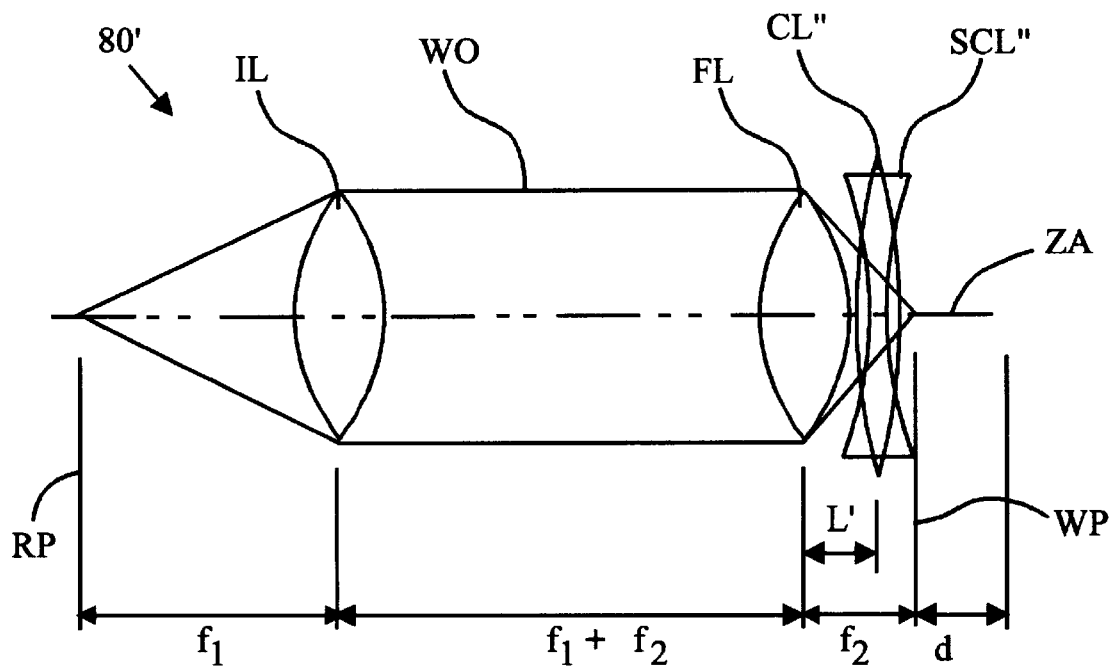
FIG. 6 shows a modified embodiment of the device of FIG. 5 with a weak rotation-free dynamic compensating lens located at the position of the effective space charge lens, with a focal length equal and opposite to that of the effective space charge lens which provides approximate effective space charge lens compensation.

The effective space charge lens SCL could conceivably be located in any one of three possible regions within the imaging section of FIG. 1. The effective space charge lens SCL can be located between the reticle and the collimating lens (Case 1), as shown in FIGS. 1 and 2. Alternatively, the space charge lens SCL' can be located between the collimating lens and the final lens (Case 2), as shown in FIGS. 3 and 4. Finally, the space charge lens SCL" can be located between the final lens and the work piece plane (Case 3), as shown in FIGS. 5 and 6. We will refer to these situations below as (Case 1), (Case 2), or (Case 3) respectively. It is an object of the invention to demonstrate a method for determining in which of the three possible areas of the imaging section an effective space charge lens SCL, SCL' or SCL" exists and more particularly a method for determining exactly where within a particular region an effective space charge lens is positioned. In the analysis which results in the formulae presented below, we have used an approximation commonly known in the art as a thin lens approximation for the lenses of the imaging section and the effective space charge lens. This approximation is accurate when the focal length of a lens is long compared to the axial length of the lens, a condition which is satisfied for the effective space charge lens. For a particular imaging system, more exact formulae can be derived taking into account the finite lens thickness.

We have found that for a hypothetical electron beam column under consideration, and described in detail below, the position of the effective space charge lens SCL is near the collimator lens. Based upon this result we conclude that Case 3 is of less practical interest, and therefore we analyze in detail Case 1 and Case 2 although the invention is applicable to all three cases and FIG. 6 shows an embodiment for case 3, while FIG. 2 shows an embodiment for case 1 and FIG. 4 shows an embodiment for case 2.

For Case 1, illustrated in FIG. 1, we obtain the following equations:

$$d = \frac{f_2^2 (L - f_1)^2}{f_1^2 (f_1 - L - f_s)}$$

$$m = \frac{-f_2 * f_s}{f_1 (L + f_s - f_1)}$$

The equations can be solved for $f_s$ and L, as follows:

$$f_s = \frac{d * f_1^3 * m}{f_2 (f_2 + f_1 * m)^2}$$

$$L = \frac{f_1 (f_2^2 + (f_2 * f_1 * m) - (d * f_1))}{f_2 (f_2 + f_1 * m)}$$

where: $0 \leq L \leq f1$ d is the distance by which the image is shifted from the nominal image plane WP in the direction away from the final lens FL.

m is the magnification of the imaging doublet.

L is the displacement of the effective space charge from the collimating lens toward the reticle.

$f_1$ is the focal length of the collimating lens IL $f_2$ is the focal length of the final lens FL $f_s$ is the focal length of the effective space charge lens SCL (a negative quantity)

The formuli are valid provided that the result obtained for L is consistent with the assumptions for Case 1, namely that $$0 \leq L \leq f1$$

For Case 2, illustrated in FIGS. 3 and 4 which are analogous to FIGS. 1 and 2 respectively, we obtain the following equations:

$$fs = m*f1*f2/d$$

$$L' = f1 + f2 - f2*(d + f2 + f1*m)/d$$

where the definitions are as before except:

L' is the displacement of the effective space charge from the collimating lens toward the final lens.

The formulae are valid provided that the result obtained for L' is consistent with the assumptions for Case 2, namely that $$0 \leq L' \leq f1 + f2$$

Simulation programs are available, e.g., Boersch 1 from MEBS Ltd, which predict the image shift and magnification for a given beam current.

For an electron beam imaging system with a 1 mm subfield at the reticle, 600 mm length imaging system, and a beam semi-angle of 2 mr (milliradians) at the reticle, a beam voltage of 75 keV, a beam current of 20 microamperes, $f_1$=240 mm and $f_2$=60 mm, the predicted image shift "d" is 49 micrometers and the predicted magnification is m=−0.24971.

Substituting these values in the formula for Case 1 we obtain $f_s$ and L.

fs=−60.275 meters

L=22.22 millimeters

It should be noted that the numerical result for L satisfies the criteria for validity of the formulae of Case 1 that is $0 \leq L \leq f1$. In other words, the assumption that the effective space charge lens is between the reticle and the collimating lens is confirmed.

Substituting these same values for "d" and "m" into the formulae for Case 2 we obtain for fs, L':

fs=−73204.9

L'=−24.49

It should be noted that the numerical result for L' does not satisfy the criteria for validity of the formulae, that is, the equation $$0 \leq L1 \leq f1 + f2$$

is not satisfied. In other words, the assumption underlying the formulae of Case 2, namely that the effective space charge lens is between the collimating lens and the final lens is not confirmed.

We conclude therefore that the given values of d and m in this example are consistent only with Case 1, i.e., that the effective Space Charge Lens is between the reticle and the collimating lens, and more particularly that fs=−60.275 meters L=22.22 millimeters k=fs*I=−1.2055×10−3 ampere*meters We have illustrated the method using values for "d" and "m" obtained by numerical simulation, but the required values for "d" and "m" can also be obtained by measurements of the image shift and magnification of the actual imaging system.

However obtained, the values for d and m are substituted in the the formulae for Case 1 and Case 2 as in the example above to determine the position of the effective space charge lens. For most doublet imaging systems self-consistent results for the space charge lens position will be obtained for either Case 1 or Case 2 but not for both, since Cases 1 and Case 2 are mutually exclusive unless the space charge lens happens to coincide with the collimator lens in which case L=L'=0. If self consistent results are obtained for neither Case 1 nor Case 2, then Case 3 obtains and formulae analogous to those given above must be developed to determine the exact position of the effective space charge lens.

Knowing the effective position and focal length of the effective space charge lens we can superpose a compensating lens at the same position thereby cancelling the image shift and magnification change at the image plane.

The compensating lens is a converging lens with a focal length equal in magnitude but opposite in sign from the focal length of the effective space charge lens.

Referring to FIG. 2, the focal length $F_C$ of the compensating lens CL must vary inversely with the beam current transmitted through the reticle, i.e., for the example given above, $$F_C = f_S = -k/I;$$

with I in Amperes.

where k=−1.2055×10⁻³ ampere*meters.

It is well known in the art how to vary focal length by means of the exciting current (magnetic lens) or applied voltage (electrostatic lens). For the magnetic lens case it is preferable to use a rotation-free lens for compensation so as not to introduce rotation errors as will be understood by those skilled in the art.

Space Charge Lens Compensation

FIG. 2 shows an embodiment of a device 10' in accordance with this invention which is a modification of the device of FIG. 1. In FIG. 2, the imaging portion is based on the particle beam column along axis ZA of FIG. 1 modified by adding a rotation-free compensating lens CL at the position of the effective space charge lens SCL. The rotation-free compensating lens CL has a focal length equal and opposite to that of effective space charge lens SCL thereby providing approximate compensation for the defocussing and magnification variation caused by the effective space charge lens SCL.

In this case there is an electron trajectory which is the trajectory with the space charge or effective space charge lens SCL but with the correction provided by the compensating lens CL.

The compensating lens CL and its associated drive electronics must be constructed so that the lens focal length, can be changed in the time interval between subfield exposures. The compensating lens CL can be magnetic or electrostatic. For a magnetic compensating lens CL there is an adjustable current source connected to lens CL. Alternatively, for an electrostatic compensating lens, there is an adjustable voltage source connected to lens CL. In addition, for a combined magnetic-electrostatic compensating lens, there are both adjustable voltage and current sources connected to lens CL as will be understood by those skilled in the art. Because of the required high frequency response and the long focal lengths required, one preferred embodiment for a magnetic compensating lens consists of an air core coil with no magnetic circuit. This approach is practical only if the compensating lens environment can be designed so that eddy current effects are negligible. A second preferred embodiment consists of a coil and a magnetic circuit composed of magnetic material with sufficient high frequency response, e.g., ferrite. Suitable lenses with ferrite are known from dynamic focus elements of electron beam lithography systems. See U.S. Pat. No. 4,245,159 of Beisswenger for "Quick Acting Electron-Optical Lenses", and U.S. Pat. No. 4,806,766 of Chisholm for "Magnetic Lens System" for a description of fast focus lenses for application to such a use.

FIG. 3 shows the imaging portion of an electron beam column 40 from the reticle plane on the left to the work piece plane on the right, showing the imaging optics of a projection system employing a doublet consisting of a collimating lens and a final lens, with an effective space charge lens located between the collimating lens and the final lens.

FIG. 4 shows an embodiment of a column 40' in accordance with this invention which is a modification of the column of FIG. 3 with a weak rotation-free dynamic compensating lens located at the position of the effective space charge lens, with a focal length equal and opposite to that of the effective space charge lens which provides approximate effective space charge lens compensation. FIG. 4, which is analogous to FIG. 2 shows the imaging portion 40' based on the particle beam column along axis ZA of FIG. 3 modified by adding a rotation-free compensating lens CL' at the position of the effective space charge lens SCL'. The rotation-free compensating lens CL' has a focal length equal and opposite to that of effective space charge lens SCL thereby providing approximate compensation for the defocussing and magnification variation caused by the effective space charge lens SCL'. Again, there is a compensated trajectory which is the trajectory with the space charge or effective space charge lens SCL but with the correction provided by the compensating lens CL.

FIG. 5 shows the imaging portion of an electron beam column 80 from the reticle plane on the left to the work piece plane on the right, showing the imaging optics of a projection system employing a doublet consisting of a collimating lens IL and a final lens, with an effective space charge lens SCL" located between the final lens FL and the work piece plane WP.

FIG. 6 shows an embodiment of a column 80' in accordance with this invention which is a modification of the column of FIG. 5 with a weak rotation-free dynamic compensating lens CL" located at the position of the effective space charge lens SCL", with a focal length equal and opposite to that of the effective space charge lens SCL" which provides approximate effective space charge lens compensation. FIG. 6, which is analogous to FIGS. 2 and 4 shows the imaging portion based on the particle beam column along axis ZA of FIG. 3 modified by adding a rotation-free compensating lens CL" at the position of the effective space charge lens SCL". The rotation-free compensating lens CL" has a focal length equal and opposite to that of effective space charge lens SCL thereby providing approximate compensation for the defocussing and magnification variation caused by the effective space charge lens SCL". In this case also, there is a compensated trajectory which is the trajectory with the space charge or effective space charge lens SCL but with the correction provided by the compensating lens CL.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A particle beam column comprising:
    a space charge compensating lens placed at a predetermined location within an imaging section of said particle beam column,
    said space charge compensating lens having a focal length adjusted as a function of variations in the transmitted beam current to eliminate image shifts and magnification changes due to variations in transmitted beam current.

2. The particle beam column of claim 1, wherein said imaging section comprises a magnetic doublet.

3. The particle beam column of claim 1 wherein:
    said imaging section is a doublet,
    a reticle, a collimating lens, a final lens and a work piece plane arranged in said column in that order,
    said space charge compensating lens is positioned between said reticle and said work piece plane,
    said space charge compensating lens having a focal length adjusted to reverse image shift caused by said variations in transmitted beam current.

4. The particle beam column of claim 3 wherein:
    said space charge compensating lens is positioned between said reticle and said final lens position,
    said space charge compensating lens having a focal length adjusted to reverse image shift caused by said variations in transmitted beam current.

5. The particle beam column of claim 1, wherein:
    said space charge compensating lens is a rotation-free dynamic lens at the position of an effective space charge lens,
    said space charge compensating lens having a focal length equal and opposite to that of said effective space charge lens thereby providing approximate compensation for defocussing caused by said effective space charge lens.

6. The particle beam column of claim 1 wherein said predetermined position is between said reticle plane and the position of a first lens of an imaging section of a particle beam column.

7. A particle beam column comprising:
    a space charge compensating lens placed at a predetermined location within an imaging section of a particle beam column,
    said space charge compensating lens having a focal length adjusted in response to variations in the transmitted beam current to eliminate image shifts and magnification changes due to variations in transmitted beam current,
    said predetermined position is between said reticle plane and the position of a first lens of an imaging section of a particle beam column,
    said imaging section is a doublet,
    a reticle and a collimating lens,
    said space charge compensating lens is positioned between said reticle and said collimating lens position,
    said space charge compensating lens being at a distance L from said collimating lens position,
    said space charge compensating lens having a focal length $F_C$, where L and $F_C$ are given by the equations as follows:

$$F_C = -f_s = -\frac{d * f_1^3 * m}{f_2 * (f_2 + f_1 * m)^2}$$

$$L = \frac{f_1(f_2^2 + (f_2 * f_1 * m) - (d * f_1))}{f_2(f_2 + f_1 * m)}$$

where:
    d is the distance by which the image is shifted from the nominal image plane
    m is the magnification of the imaging doublet
    L is the distance from said collimating lens to an effective space charge lens
    $f_1$ is the focal length of the collimating lens IL
    $f_2$ is the focal length of the final lens FL
    $f_s$ is the focal length of the effective space charge lens SCL (a negative quantity), and
    d and m are measured or calculated at said transmitted beam current.

8. The particle beam column of claim 1, wherein:
    said imaging section comprises a reticle, a collimating lens, a final lens and a work piece plane, and
    said space charge compensating lens is located between said collimating lens position and said final lens position.

9. The particle beam column of claim 1, wherein: said imaging section comprises:
    a reticle,
    a magnetic doublet comprising a collimating lens and a final lens, and a work piece plane, and
    said space charge compensating lens is located between said collimating lens position and said final lens position.

10. A particle beam column comprising:
    a space charge compensating lens placed at a predetermined location within an imaging section of a particle beam column,
    said space charge compensating lens having a focal length adjusted in response to variations in the transmitted beam current to eliminate image shifts and magnification changes due to variations in transmitted beam current,
    said space charge compensating lens is positioned between said reticle and said final lens position,
    said space charge compensating lens having a focal length adjusted to reverse image shift caused by said variations in transmitted beam current, said column including a reticle, a doublet and a work piece plane, said doublet including a collimating lens and a final lens, said space charge compensating lens is positioned between said reticle and said collimating lens position, said space charge compensating lens being at a distance L' from said collimating lens position, said space charge compensating lens having a focal length $F_C$, where L' and $F_C$ are given by the equations as follows:

$$F_C = -f_s = -m^* f_1^* f_2 / d$$

$$L' = f_1 + f_2 - f_2^*(d + f_2 + f_1^* m)/d$$

where:

d is the distance by which the image is shifted from the nominal image plane m is the magnification of the imaging doublet L' is the distance from the collimating lens to the final lens $f_1$ is the focal length of the collimating lens CL $f_2$ is the focal length of the final lens FL $f_s$ is the focal length of the effective space charge lens SCL, a negative quantity, and d and m are measured or calculated at said transmitted beam current.

11. The particle beam column of claim 1, wherein:

said column includes a reticle, a collimating lens, a final lens and a work piece plane, and said space charge compensating lens is located between said final lens position and said work piece plane.

12. The particle beam column of claim 1, wherein:

said imaging section comprises:
 a reticle,
 a magnetic doublet comprising a collimating lens and a final lens, and a work piece plane, and said space charge compensating lens is located between said final lens position and said work piece plane.

13. A method of providing space charge compensation of a particle beam column including an imaging system including:

placing a space charge compensating lens within the imaging system of said particle beam column, and adjusting the focal length $F_C$ of said space charge compensating lens to eliminate image shifts and/or magnification changes due to variations in transmitted beam current.

14. The method of claim 13, wherein:

said space charge compensating lens is a rotation-free dynamic focus lens at the position of an effective space charge lens, said space charge compensating lens having a focal length $F_C$ equal and opposite to that of effective space charge lens thereby providing approximate compensation for the defocussing caused by the effective space charge lens.

15. The method of claim 14, wherein said imaging system comprises a doublet.

16. A method of compensating the imaging section of a particle beam column for space charge effects comprising:

determining the image position and magnification of the imaging section in the absence of space charge effects, determining the image position and magnification of the imaging section for a known high beam current sufficient to produce space charge effects, using the image shift and magnification data for a transmitted beam current to determine the position of the effective space charge lens, and the relationship between the beam current and the focal length of the effective space charge lens, incorporating into said imaging system a space charge compensating lens aligned with the location of said effective space charge lens, and adjusting the focal length $F_C$ of said space charge compensating lens to be equal in magnitude and sign to the focal length of said space charge lens for all beam currents.

17. The of claim 16 wherein:

said imaging system is a doublet and positioning and energizing said space charge compensating lens according to formulae and measurements of calculated image shift and magnification data.

18. The method of claim 16 wherein:

said imaging system is a doublet, positioning said space charge compensating lens between a reticle plane and a collimating lens and energizing said space charge compensating lens according to formulae and measurements of calculated image shift and magnification data.

19. The method of claim 16 wherein:

said imaging system is a doublet, positioning said space charge compensating lens between a collimating lens and a final lens, and energizing said space charge compensating lens according to formulae and measurements of calculated image shift and magnification data.

20. The method of claim 16 wherein:

said imaging system is a doublet, positioning said space charge compensating lens between a final lens and a work piece plane, and energizing said space charge compensating lens according to formulae and measurements of calculated image shift and magnification data.

* * * * *